United States Patent [19]
Bruel et al.

[11] Patent Number: 4,585,945
[45] Date of Patent: Apr. 29, 1986

[54] PROCESS AND APPARATUS FOR IMPLANTING PARTICLES IN A SOLID

[75] Inventors: Michel Bruel, Veurey; Alain Soubie, St. Egreve; Philippe Spinelli, La Tronche, all of France

[73] Assignee: Commissariat a l'Energie Atomique, Paris, France

[21] Appl. No.: 559,439

[22] Filed: Dec. 8, 1983

[30] Foreign Application Priority Data

Dec. 10, 1982 [FR] France .................... 82 20720

[51] Int. Cl.$^4$ ............................................ H01J 37/317
[52] U.S. Cl. .......................... 250/492.2; 250/492.3; 250/251; 427/35; 427/38
[58] Field of Search ............... 250/492.2, 492.3, 251; 427/35, 38; 204/192 N

[56] References Cited

U.S. PATENT DOCUMENTS 4,108,751  8/1978  King ..................... 204/192 N

FOREIGN PATENT DOCUMENTS 1558881  3/1968  France .

OTHER PUBLICATIONS

Wada, *Nuclear Instruments and Methods*, vol. 182/183, Apr.–May 1981, pp. 131–136.

*Primary Examiner*—Alfred E. Smith
*Assistant Examiner*—Jack I. Berman
*Attorney, Agent, or Firm*—James E. Nilles

[57] ABSTRACT

In a process for implanting particles in a solid in which is produced a substantially parallel beam of high-energy primary particles secondary particles are placed in the path of the latter and by interaction with the primary particles are projected towards the target with a sufficiently high energy level to penetrate the same. The secondary particles are in the gaseous state, the gas occupying an area facing the target.

The apparatus for implanting particles in a solid has a target support and a solid target in a vacuum enclosure. It also has a source of high-energy primary particles, which supplies a substantially parallel beam thereof, a source of the secondary particles to be implanted in the target, a means for confining the secondary particles and communicating with the secondary particle source and having a primary opening for receiving the primary particle beam and a secondary opening for ejecting the secondary recoil particles towards the target.

10 Claims, 3 Drawing Figures

PROCESS AND APPARATUS FOR IMPLANTING PARTICLES IN A SOLID

BACKGROUND OF THE INVENTION

The present invention relates to a process and to an apparatus for implanting particles in a solid. It is more particularly applied in the doping of semiconductors, especially for constructing MOS transistors and low value resistors in bipolar circuits.

A known method for implanting particles in a solid is ion implantation. In this case, the ions of the species which it is wished to implant in the solid are produced in an ion source. This is followed by the production of a beam of said ions which is accelerated to give it the necessary energy level for penetrating the solid.

An important disadvantage of this method is that it is difficult to obtain a pure ion beam, i.e. an ion beam containing only the ions to be implanted in the solid. Thus, the ion source, which produces the ions, e.g. in a conventional manner by an electrical discharge in a gas, produces in a random manner the ions of the species which it is wished to implant in the solid, together with other ions. It is then necessary to sort the ions produced, in order only to accelerate those which it is wished to implant in the solid.

A known process based on ion implantation is recoil implantation. In this method, the solid is covered with a thin coating of the element which it is wished to implant there. A beam of high-energy primary particles, e.g. argon ions is then directed towards the solid. These high-energy primary particles collide with the atoms on the thin coating and transfer thereto their energy, which enables the atoms of the thin coating to penetrate the solid.

This recoil implantation method is mainly limited by ion erosion of the thin coating deposited on the solid as implantation takes place. This disappearance of the coating limits the doses of particles which can be implanted in the solid.

SUMMARY OF THE INVENTION

The present invention aims at obviating these disadvantages by replacing the thin coating of the particles to be implanted in the recoil implantation method by a gas of particles to be implanted facing the solid.

The present invention more specifically relates to a process for the implantation of particles in a solid, in which a substantially parallel beam of high-energy primary particles is produced and in the path of said substantially parallel beam of high-energy primary particles is placed secondary particles which, by interaction with the high-energy primary particles, are projected towards the target also with an adequate energy to penetrate it, wherein the secondary particles are in the gaseous state, said gas occupying an area facing the target.

According to a preferred variant, the direction of the substantially parallel beam of high-energy primary particles is roughly perpendicular to the target surface.

According to a secondary feature, the primary particles are electrically charged.

According to another secondary feature, the secondary particles are electrically neutral.

The invention also relates to an apparatus for implanting particles in a solid comprising, in a vacuum enclosure, a target support and a solid target, wherein it also comprises a high-energy primary particle source supplying a substantially parallel beam of high-energy primary particles a source of secondary particles to be implanted, means for the confinement of secondary particles communicating with the secondary particle source, having a primary opening for receiving the substantially parallel beam of high-energy primary particles and a secondary opening to enable the recoil secondary particles to reach the target.

According to a preferred embodiment, the confinement means has a generally cylindrical shape, with generatrixes parallel to the direction of the substantially parallel beam of high-energy primary particles and it comprises an appendage forming a receptacle for the secondary particle source.

According to a secondary feature, the confinement means comprises a means for heating the secondary particle gas.

According to another secondary feature, the confinement means is provided with cooling means for condensing the secondary particle gas.

According to another secondary feature, the secondary means is provided with a multicollimator between the primary opening and the area in which the secondary particle gas prevails and another multicollimator between said area and the secondary opening.

According to another secondary feature, the two collimators are aligned.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
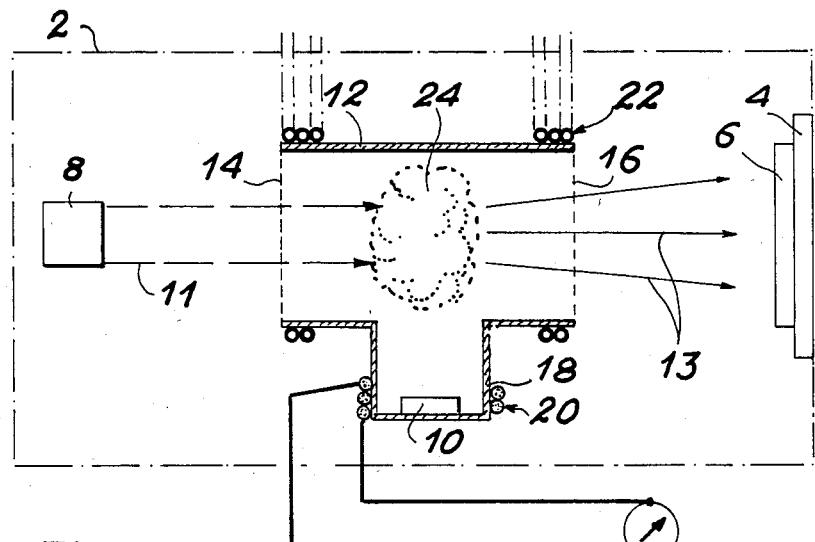
FIG. 1 an embodiment of the apparatus according to the invention.

FIG. 1 shows an apparatus for implanting particles in a solid according to the invention. The various components of the apparatus are placed in a vacuum enclosure, which comprises a target support 4, to which is fixed a target 6 constituting the solid in which it is wished to implant the particles. It also comprises a source 8 of high-energy primary particles supplying a substantially parallel beam 11 of high-energy primary particles. The source 8 of high-energy primary particles comprises a primary particle source and a means for accelerating these particles. This source 8 of high-energy primary particles is shown in enclosure 2 in FIG. 1. It is obvious that source 8 can also be located in some enclosure other than 2 communicating by an orifice with enclosure 2.

The apparatus also comprises a source 10 of the secondary particles to be implanted and which is located in a receptacle 18 communicating with a confinement means 12. The secondary particles produced by source 10 form a gas 24, whose spatial extension is limited by the confinement means 12, which maintain gas 24 on the path of the parallel beam 11 of high-energy primary particles. The source 10 of secondary particles to be implanted is shown in the form of a solid in the drawing. The gas 24 of secondary particles is in this case obtained by liquefaction and then evaporation, or directly by sublimation of the solid. If the secondary particles are in the liquid state in receptacle 18, it is merely necessary to evaporate them. If the secondary particles are gaseous under the temperature and pressure conditions of the operation, source 10 could be a nozzle or a porous tube connected to a reservoir of secondary particle gas optionally located outside enclosure 2. Finally, it is possible to replace gas 24 by a secondary particle flux, e.g. a vacuum evaporation flux or an atomized particle flux.

The confinement means 12 has a primary opening 14 enabling a substantially parallel beam 11 of high energy primary particles to interact with the secondary particles of gas 24. It also has a secondary opening 16 enabling the recoil secondary particles 13 to reach target 6.

The energy transfer between the high-energy primary particles of the substantially parallel beam 11 and the secondary particles of gas 24 improves as the percentage of primary particles of the parallel beam 11 interacting with the secondary particles increases.

In order that there is an optimum energy transfer, it is necessary that the mean free travel in gas 24 of high-energy primary particles of the substantially parallel beam 11 is of the same order of magnitude as the spatial extension of gas 24 in the direction of the parallel beam 11 of high-energy primary particles. This mean free travel of the high-energy primary particles of the substantially parallel beam 11 is a function of the density of gas 24, which can be adjusted by heating means 20. The operating procedure is simple and consists of supplying a substantially parallel beam 11 of high-energy primary particles with a sufficient power to enable the particles to traverse gas 24 and reach target 6. The density of gas 24 is then increased by heating it with heating means 20, until it is no longer possible to observe primary particles reaching target 6.

Finally, the confinement means 12 comprises cooling means 22 located close to the primary opening 14 and the secondary opening 16 which carry out the condensation of the secondary particle gas tending to escape from the confinement means 12. This improves the confinement of gas 24 and obviates any pollution of enclosure 2 by secondary particles.

Figure 2:
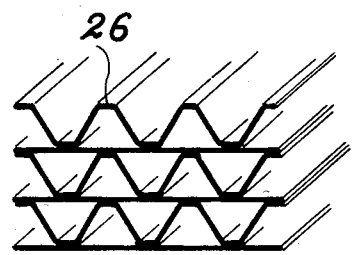
FIG. 2 a cross-section through a multicollimator.

FIG. 2 is a cross-section of a multicollimator which is constituted by the juxtapositioning of parallel collimators, such as collimator 26. In FIG. 2, the section of these collimators 26 is trapezoidal. However, it is obvious that this section can have a different geometry, e.g. circular, square, triangular, etc. This multicollimator can be simply produced by superimposing alternately flat and undulating sheets.

Figure 3:
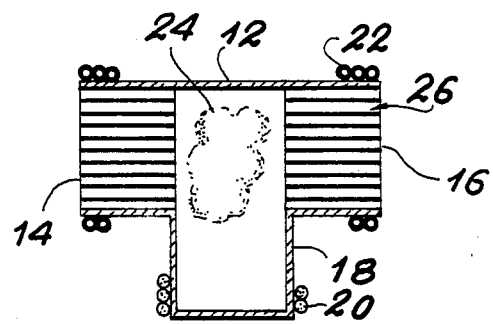
FIG. 3 a special embodiment of the confinement means.

FIG. 3 shows a special embodiment of confinement means 12 comprising a receptacle 18 provided with heating means 20 and cooling means 22. It also comprises two multicollimators, one located between the primary opening 14 of confinement means 12 and the area in which prevails the gas 24 of the secondary particles to be implanted and the other between said same area and the secondary opening 16 of confinement means 12. These two multicollimators permit a better confinement of gas 24 in the central part of the confinement means 12, thereby reducing gas losses. The axis of the collimators is preferably parallel to the parallel beam of high-energy alpha particles, so that the high-energy primary particles reach gas 24 without interacting with the multicollimator, i.e. without energy loss.

What is claimed is:

1. A process for the implantation of particles in a solid, in which a substantially parallel beam of high-energy primary particles is produced and in the path of said substantially parallel beam of high-energy primary particles is placed secondary particles which, by interaction with the high-energy primary particles, are projected towards the target also with an adequate energy to penetrate it, wherein the secondary particles are in the gaseous state, said gas occupying an area facing the target.

2. A process for the implantation of particles according to claim 1, wherein the direction of the substantially parallel beam of high-energy primary particles is roughly perpendicular to the surface of the target.

3. A process for the implantation of particles according to claim 1, wherein the secondary particles are electrically charged.

4. A process for the implantation of particles according to claim 1, wherein the secondary particles are electrically neutral.

5. An apparatus for implanting particles in a solid comprising, in a vacuum enclosure, a target support and a solid target, wherein it also comprises a high-energy primary particle source supplying a substantially parallel beams of high-energy primary particles, a source of secondary particles to be implanted, means for the confinement of secondary particles communicating with the secondary particle source, having a primary opening for receiving the substantially parallel beam of high-energy primary particles and a secondary opening to enable the recoil secondary particles to reach the target.

6. An apparatus according to claim 5, wherein the confinement means has a generally cylindrical shape, with generatrixes parallel to the direction of the substantially parallel beam of high-energy primary particles and it comprises an appendage forming a receptacle for the secondary particle source.

7. An apparatus according to claim 5, wherein the confinement means comprises a means for heating the secondary particle gas.

8. An apparatus according to claim 5, wherein the confinement means is provided with cooling means for condensing the secondary particle gas.

9. An apparatus according to claim 5, wherein the confinement means is provided with a multicollimator between the primary opening and the area in which prevails the secondary particle gas and a further multicollimator between this area and the secondary opening.

10. An apparatus according to claim 9, wherein the two multicollimators are aligned.

* * * * *